(12) United States Patent
Printzis

(10) Patent No.: US 6,525,677 B1
(45) Date of Patent: Feb. 25, 2003

(54) METHOD AND APPARATUS FOR AN OPTICAL LASER KEYPAD

(75) Inventor: George A. Printzis, Niles, IL (US)

(73) Assignee: Motorola, Inc., Schaumberg, IL (US)

( * ) Notice: Subject to any disclaimer, the term of this patent is extended or adjusted under 35 U.S.C. 154(b) by 381 days.

(21) Appl. No.: 09/649,699

(22) Filed: Aug. 28, 2000

(51) Int. Cl.$^7$ ............................................. H03M 11/26
(52) U.S. Cl. ...................... 341/31; 178/18.09; 345/170; 379/368
(58) Field of Search ............................ 341/22, 26, 31; 178/18.09; 345/170; 379/368

(56) References Cited

U.S. PATENT DOCUMENTS

| | | | | |
|---|---|---|---|---|
| 3,372,789 A | * | 3/1968 | Thiele et al. ............... | 400/479 |
| 3,526,775 A | * | 9/1970 | Friedrich et al. ........... | 250/221 |
| 3,886,544 A | * | 5/1975 | Narodny ...................... | 341/31 |
| 4,205,304 A | * | 5/1980 | Moore ........................... | 341/5 |
| 4,379,968 A | * | 4/1983 | Ely et al. ..................... | 250/229 |
| 4,387,367 A | * | 6/1983 | Fisher .......................... | 341/31 |
| 4,641,026 A | * | 2/1987 | Garcia, Jr. .................. | 250/229 |
| 4,931,794 A | * | 6/1990 | Haag et al. .................. | 341/31 |
| 5,477,223 A | * | 12/1995 | Destremps ................... | 341/31 |
| 5,736,976 A | | 4/1998 | Cheung ........................ | 345/168 |
| 6,125,180 A | * | 9/2000 | Lester et al. ................ | 379/368 |

\* cited by examiner

*Primary Examiner*—Michael Horabik
*Assistant Examiner*—Hung Dang
(74) *Attorney, Agent, or Firm*—Brian M. Mancini

(57) ABSTRACT

An optical laser numeric keypad (100) provides a digital signal indicative of which of a plurality of key locations is selected. The optical laser numeric keypad (100) comprises a plurality of optical sensors (132 and 134) each configured to respond to a change in a received light quantity and to provide an electrical signal in response to a selection of a key at a key location. The received light quantity of at least one of the plurality of optical sensors (132 and 134) is changeable by selection of a key location.

16 Claims, 3 Drawing Sheets

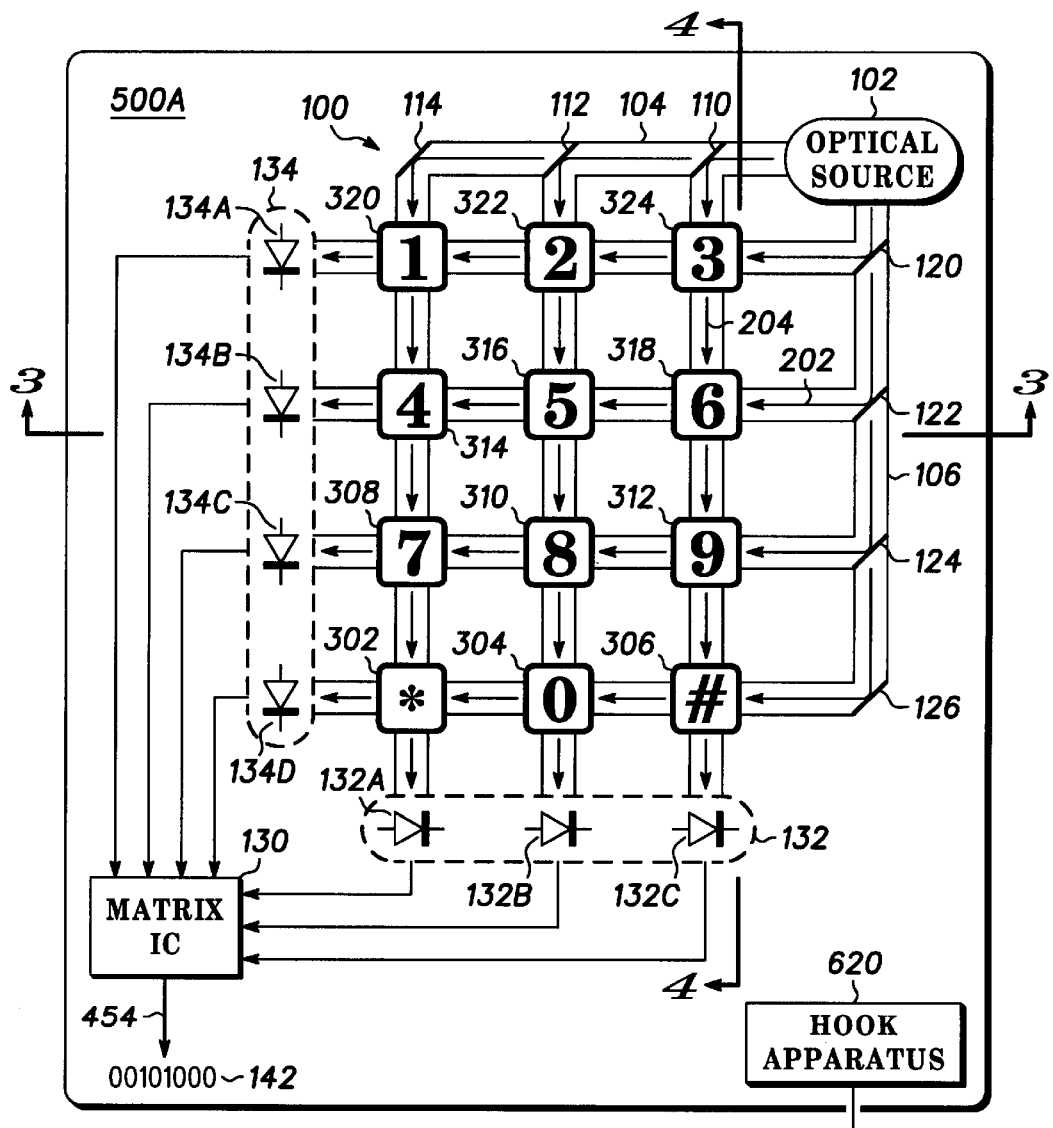
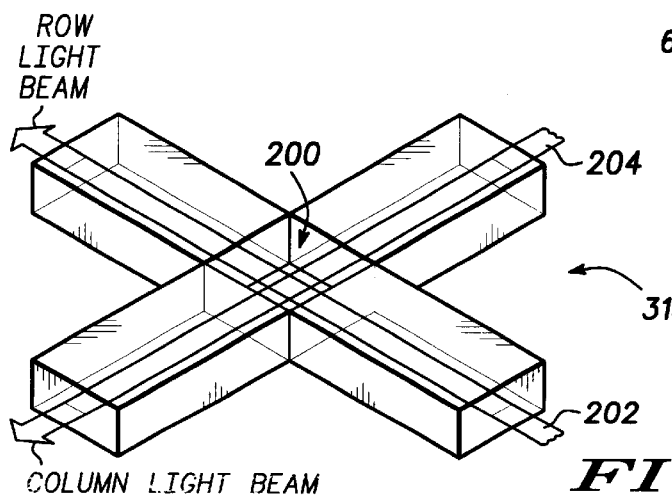
*FIG. 1*
*FIG. 2*

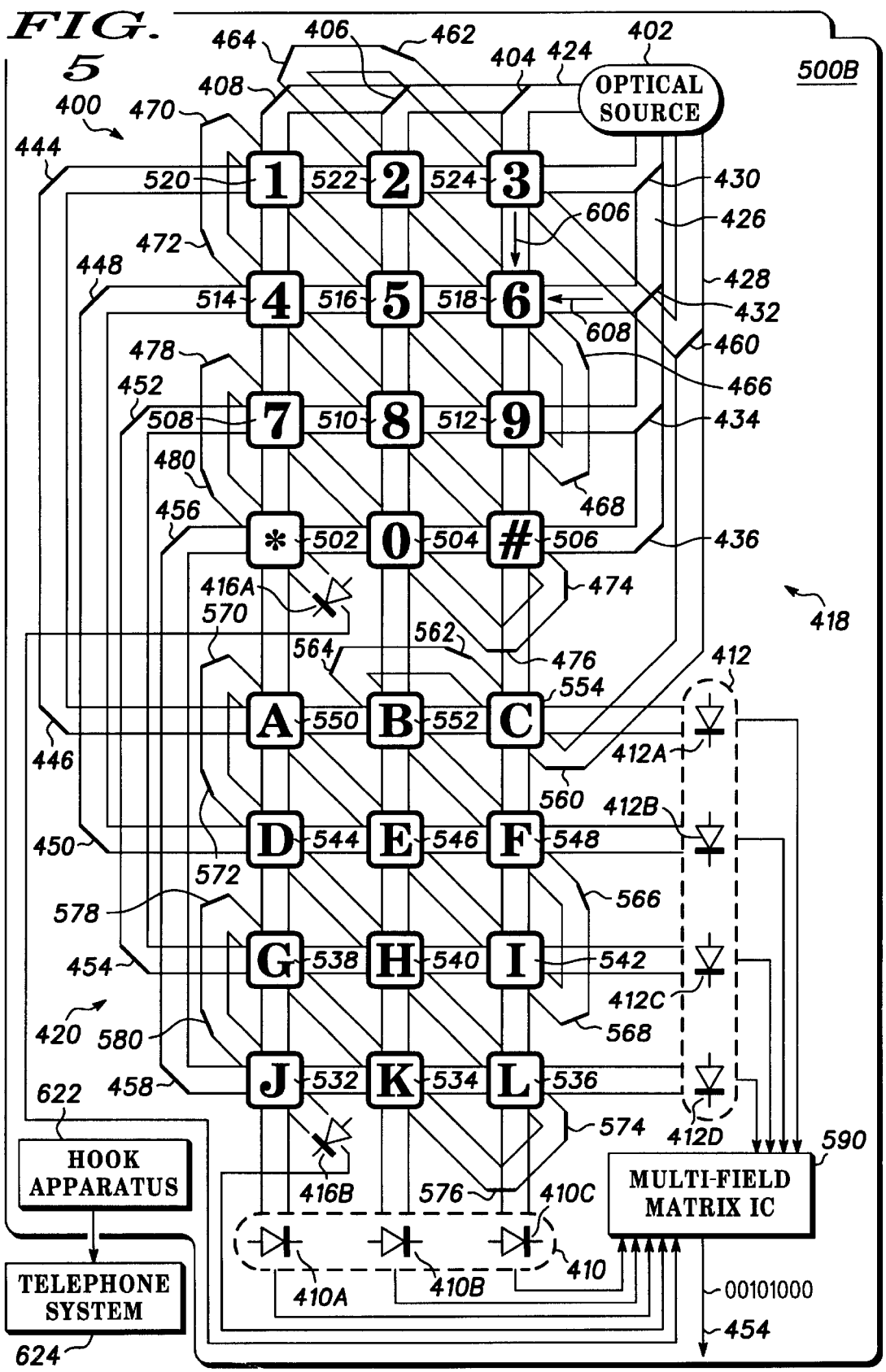

METHOD AND APPARATUS FOR AN OPTICAL LASER KEYPAD

FIELD OF THE INVENTION

The present invention relates generally to methods and apparatuses for electronic devices having keys for entering data, and more particularly to methods and apparatuses for mobile wireless devices having keypads.

BACKGROUND OF THE INVENTION

Wireless telephones have allowed many busy people the freedom to communicate while traveling. For many people, traveling even on a brief errand without a wireless telephone is all but unthinkable.

Unfortunately, wireless telephones can be bulky. Bulky wireless telephones, unfortunately, are currently a fact of life for many people. Although the size of the electronic circuits within a wireless telephone may diminish as manufacturing processes evolve, the fundamental nature of wireless telephones requires substantial electronic equipment.

Not only are wireless telephones bulky, but they are also prone to failure. A typical wireless telephone has several moving parts, including springs and other mechanisms in the buttons of the keypad. When a user presses a key button, the button slides downwards and engages an electrical contact, similar to a relay. The spring then restores the button to be pressed again. The failure of even a single spring within a keypad can render the telephone substantially useless to the owner, who then must take the telephone in for repair.

Accordingly, there exists a need for a wireless telephone having a thin profile and without a large number of moving parts.

BRIEF DESCRIPTION OF THE DRAWINGS

FIG. 1 is an optical laser numeric keypad, according to one embodiment of the present invention.

FIG. 2 is a path of light through the numeric keypad of FIG. 1.

FIG. 5 is an optical laser numeric keypad, according to one embodiment of the present invention.

DETAILED DESCRIPTION OF THE PREFERRED EMBODIMENT

Figure 3:
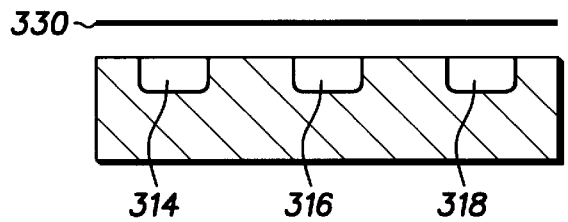
FIG. 3 is cross section of one of the rows in the keypad of FIG. 1, illustrating a path of light through one of the rows of numeric keypad.

Generally stated, the disclosed optical laser numeric keypad includes a paradigm shift in the construction of keypads, including keypads used for wireless telephones. According to the described embodiments of the present invention, keypad recognition devices use the interruption of light rather than the electrical recognition of mechanical activity to register a selection of keys. Accordingly, no moving parts are necessary for the input of data.

FIG. 1 shows an optical laser numeric keypad 100, according to one embodiment of the present invention. The optical laser numeric keypad 100 resides within a wireless telephone 500A. The wireless telephone 500A includes a hook apparatus 620 that allows a user to indicate to begin a connection with a telephone system 624. The optical laser numeric keypad 100 is designed such that a user may enter a sequence of numbers by pressing the keys, or otherwise selecting key locations, as a user would ordinarily enter a telephone number into a touch-tone keypad. Key locations as shown in FIG. 1, however, each include an intersection of light beams that may be interrupted. For example, A "6" key location 318 includes an intersection of a light beam 202 and a light beam 204. A key location may be a region that is devoid of opaque matter, and through which light beams may pass except when an opaque object is inserted into the region. Each of the key locations of the optical laser numeric keypad 100 of FIG. 1, for example, may be configured as a cavity having a top opening for a user to insert a finger and also having at least one optical path through the cavity. Alternatively, several key locations may be collectively configured as a single cavity, so that a user may move a finger from a first key location to a second key location, and thereby select a first key and then a second key, without removing the finger from the cavity. In one embodiment, the key locations replace pad buttons of earlier keypads, which included moving parts.

The optical laser numeric keypad 100 includes a plurality of keys at various locations. For example, conventional alphanumeric keys and additional keys, such as the function keys such as the "SEND" or the "REDIAL" may be included. Ordinarily, the optical laser numeric keypad 100 includes twelve keys, organized into four rows and three columns, but other suitable configurations, including non-orthogonal row and columns may be used. Each key location is at the intersection of a row and a column.

The optical laser numeric keypad 100 also includes an optical source 102, such as a ambient light, a laser diode, or other LED (light emitting diode). The optical source 102 may be, for example, a Hamamatsu AlGaAs double-hetero visible laser diode, either Model No. RLD-78MIT, Model No. RLD-78PIT, or Model No. RLD-78NIT, manufactured by Molecular Beam Epitaxy, especially developed for fiber transmission products.

The optical source 102 provides a light beam to the optical laser numeric keypad 100. In one embodiment, the light may be visible light. In one such embodiment the light is used to illuminate the optical laser numeric keypad 100. In another embodiment, the light is not used to illuminate the optical laser numeric keypad 100. In yet another embodiment, the light is infrared. In one embodiment, the light from the laser diode is multi-chromatic, and includes several frequencies, all of which fall within a first frequency band.

The light beam is split into two light pipes. This beam splitting may be performed by a partially reflecting reflector, or may be performed simply by placing ends of two light pipes and adjacent to the laser diode. In either case, light from the optical source 102 is configured to propagate along each of the horizontally oriented light pipe 104 and the vertically oriented light pipe 106. The horizontally oriented light pipe 104 and the vertically oriented light pipe 106 may simply be hollow light pipes, waveguides, or an optical medium such as a thin fiber cable.

The optical source 102 may be located anywhere with respect to the optical laser numeric keypad 100, including at one corner of the optical laser numeric keypad 100. In FIG. 1, the optical source 102 is placed at a corner of the optical laser numeric keypad 100, and each of the horizontally oriented light pipe 104 and the vertically oriented light pipe 106 is situated along one of the edges of the optical laser numeric keypad 100. The optical source 102, the horizontally oriented light pipe 104 and the vertically oriented light pipe 106 are therefore in the same plane as the optical laser numeric keypad 100. However, any suitable location may be used. One of the light pipes is oriented horizontally and is located at the "top" of the optical laser numeric keypad 100, above the "1" key location 320, the "2" key location 322, and the "3" key location 324. The other light pipe is oriented vertically and is located along the "right edge" of the optical laser numeric keypad 100, to the right of the "3" key location 324, the "6" key location 318, the "9" key location 312, and the "#" key location 306. In one embodiment having several optical laser numeric keypad areas, such as wireless telephones having a numeric key portion and a control key portion, the vertically oriented light pipe 106 may extend past several of the portions. Also, because the optical laser numeric keypad 100 has more rows than columns, more light may be directed into the vertically oriented light pipe 106 than into the horizontally oriented light pipe 104.

The horizontally oriented light pipe 104 includes two optical diverters and a horizontally oriented light pipe optical reflector 114. The optical diverters are implemented as a horizontally oriented light pipe first hologram 110 and a horizontally oriented light pipe's second hologram 112, and the horizontally oriented light pipe's optical reflector 114 is also implemented as a hologram. For example, each hologram may be, for example, a hologram manufactured by Motorola, Inc. The first a horizontally oriented light pipe first hologram 110 in the horizontally oriented light pipe 104 is a partially reflective, partially transmissive mirror created by holography.

The first horizontally oriented light pipe first hologram 110 is a ⅓ reflector. This means that the first horizontally oriented light pipe first hologram 110 is designed to reflect approximately one-third of the light the first a horizontally oriented light pipe first hologram 110 receives. The first horizontally oriented light pipe first hologram 110 is also designed to transmit approximately two thirds of the light the first a horizontally oriented light pipe first hologram 110 receives. The reflected light is directed toward the "3" key location 324, the "6" key location 318, the "9" key location 312, and the "#" key location 306, and the transmitted light is allowed to propagate toward the horizontally oriented light pipe second hologram 112. Accordingly, the "3" key location 324, the "6" key location 318, the "9" key location 312, and the "#" key location 306 receive one-third of the light in the horizontally oriented light pipe 104.

The horizontally oriented light pipe second hologram 112 in the horizontally oriented light pipe 104 is a partially reflective, partially transmissive mirror, also created by holography. The horizontally oriented light pipe second hologram 112 is a 50% reflector. This means that the horizontally oriented light pipe second hologram 112 is designed to reflect approximately one-half of the light the horizontally oriented light pipe second hologram 112 receives toward the "2" key location 322, the "5" key location 316, the "8" key location 310, and the "0" key location 304. This also means that the horizontally oriented light pipe second hologram 112 is designed to transmit approximately one-half of the light the horizontally oriented light pipe second hologram 112 receives toward the horizontally oriented light pipe optical reflector 114. Since the horizontally oriented light pipe second hologram 112 in the horizontally oriented light pipe 104 receives only two-thirds of the light that the first light pipe provides, the column having the "2" key location 322, the "5" key location 316, the "8" key location 310, and the "0" key location 304 receives one-third of the light in the horizontally oriented light pipe 104. Also, the horizontally oriented light pipe optical reflector 114 receives one-third of the light in the horizontally oriented light pipe 104.

The horizontally oriented light pipe optical reflector 114 reflects all of the light that the horizontally oriented light pipe optical reflector 114 receives to the "1" key location 320, the "4" key location 314, the "7" key location 308, and the "*" key location 302. Because the horizontally oriented light pipe optical reflector 114 receives one-third of the light in the horizontally oriented light pipe 104, the column having the "1" key location 320, the "4" key location 314, the "7" key location 308, and the "*" key location 302 receives one-third of the light in the horizontally oriented light pipe 104.

The vertically oriented light pipe 106 includes three optical diverters (implemented as a vertically oriented light pipe first hologram 120, a vertically oriented light pipe second hologram 122, and a vertically oriented light pipe third hologram 124) and an optical reflector 126 (also implemented as a hologram). The vertically oriented light pipe vertically oriented light pipe first hologram 120 in the vertically oriented light pipe 106 is a partially reflective, partially transmissive mirror created by holography. The vertically oriented light pipe first hologram 120 is a 25% reflector. This means that the vertically oriented light pipe first hologram 120 is designed to reflect approximately one-fourth of the light that the vertically oriented light pipe first hologram 120 receives toward the "1" key location 320, the "2" key location 322, and the "3" key location 324. This means that the vertically oriented light pipe first hologram 120 is designed to transmit approximately three-fourths of the light that the vertically oriented light pipe first hologram 120 receives toward the second hologram 122. Accordingly, the "1" key location 320, the "2" key location 322, and the "3" key location 324 receive one-fourth of the light in the vertically oriented light pipe 106.

The second hologram 122 in the vertically oriented light pipe 106 is a partially reflective, partially transmissive mirror. The second hologram 122 is a ⅓ reflector. This means that the second hologram 122 is designed to reflect approximately one-third of the light the second hologram 122 receives toward the "4" key location 314, the "5" key location 316, and the "6" key location 318. This also means that the second hologram 122 is designed to transmit approximately two-thirds of the light the second hologram 122 receives toward the third hologram 124. Since the second hologram 122 in the vertically oriented light pipe 106 receives only three-fourths of the light in the vertically oriented light pipe 106 and reflects one-third of the light that the second hologram 122 receives, the column having the "4" key location 314, the "5" key location 316, and the "6" key location 318 receives one-fourth of the light in the vertically oriented light pipe 106. Also, since the second hologram 122 in the vertically oriented light pipe 106 receives only three-fourths of the light in the vertically oriented light pipe 106 and transmits two-thirds of the light that the second hologram 122 receives, the third hologram 124 receives half of the light in the vertically oriented light pipe 106.

The third hologram 124 in the vertically oriented light pipe 106 is a partially reflective, partially transmissive mirror created by holography. The third hologram 124 is a 50% reflector. This means that the third hologram 124 is designed to reflect approximately one-half of the light the third hologram 124 receives toward the "7" key location 308, the "8" key location 310, and the "9" key location 312.

This means that the third hologram 124 is designed to transmit approximately one-half of the light the third hologram 124 receives toward the optical reflector 126. Since the third hologram 124 in the vertically oriented light pipe 106 receives half of the light in the vertically oriented light pipe 106 and transmits half of the light the third hologram 124 receives, the "7" key location 308, the "8" key location 310, and the "9" key location 312 receive one-fourth of the light in the vertically oriented light pipe 106. Also, since the third hologram 124 in the vertically oriented light pipe 106 receives only half of the light in the vertically oriented light pipe 106 and transmits half of the light that the third hologram 124 receives, the optical reflector 126 receives one-fourth of the light in the vertically oriented light pipe 106.

The optical reflector 126 reflects all of the light that the optical reflector 126 receives to the "*" key location 302, the "0" key location 304, and the "#" key location 306. Because the optical reflector 126 receives one-third of the light in the horizontally oriented light pipe 104, the column having the "*" key location 302, the "0" key location 304, and the "#" key location 306 receives one-fourth of the light in the horizontally oriented light pipe 104.

In other embodiments, the holograms are replaced with dispersion gratings. In such embodiments, the optical source generates a full spectrum of frequencies. Various ranges of frequencies contain various portions of the electromagnetic energy propagating along a light pipe. For example, a dispersion grating that selects a range of frequencies containing 50% of the electromagnetic energy in the horizontally oriented light pipe may replace the 50% reflector (i.e., The horizontally oriented light pipe the second hologram 112).

In other embodiments, the holograms are replaced with birefringent or multirefringent material. In such embodiments, the optical source generates light beams having multiple polarizations. Various polarizations contain various portions of the electromagnetic energy propagating along a light pipe. For example, a birefringent material that selects a polarization containing 50% of the electromagnetic energy in the horizontally oriented light pipe may replace the 50% reflector (i.e., The horizontally oriented light pipe the second hologram 112).

Referring again to FIG. 1, the optical laser numeric keypad 100 also includes a plurality of row optical sensors 134. Each of the rows has a row optical sensor at the left edge of the optical laser numeric keypad 100. Each of the plurality of optical sensors 134 can be, for example, a photo diode. For example, the optical sensor may be a Hamamatsu SI PIN photodiode Model #S5971, S5972, S5973, or S5973-01. Each is sufficiently sensitive to detect light energy no greater than one-fourth the light in the vertically oriented light pipe 106. Each photo diode detects whether light passing through the row is obstructed in at least one cavity at a key location in the corresponding row. Similarly, the optical laser numeric keypad 100 also includes a plurality of column optical sensors 132. Each of the columns has a column optical sensor at the bottom edge of the optical laser numeric keypad 100. Each of the plurality of optical sensors 132 can be, for example, a photo diode. Each is sufficiently sensitive to detect light energy no greater than one-fourth the light in the vertically oriented light pipe 106. Each photo diode detects whether light passing through the column is obstructed in at least one cavity at a key location in the corresponding column.

Each of the row sensors 134 provides a signal when no location in the corresponding row interrupts the light diverted to the row. Each of the column optical sensors 132 provides a signal when no location in the column interrupts the light diverted to the column. Each sensor provides an electrical signal determinative of whether the light through any cavity in the corresponding row or column is interrupted.

A user selects a key location by inserting a finger or other object into a cavity to interrupt the light beam going through the cavity. It is normally expected that at most one key will be selected at any given time; that is, that a user will not select multiple keys at once, and will not select a second key until a first key is released.

Thus, the selection of a single key location causes two optical sensors to detect an interruption in the light being received. The two optical sensors include one row column sensor and one column sensor, comprising a pair of optical sensors corresponding to the selected key location. In one embodiment, an optical sensor is reserved for each key location, such that only one optical sensor is selected when a single key location is selected.

The optical laser numeric keypad 100 of FIG. 1 also has, corresponding thereto, a matrix IC 130, coupled to receive a row signal from each of the row optical sensors 134 and a column signal from each of the column optical sensors 132. The matrix IC 130 provides a location identifier 454. The matrix IC 130 includes an eight-bit parallel-load input buffer. Seven bits of the matrix IC 130 are coupled to receive the electrical signals from the various optical sensors 132–134. A bit of the matrix IC 130 is coupled to each of the various optical sensors 132–134. The remaining bit of the matrix IC 130 input buffer is not used. Alternately, the remaining bit is used for error detection. In response to the electrical signals from the various optical sensors 132–134, the matrix IC 130 provides a digital signal 142 that indicates, as a binary number, which key location is selected.

The matrix IC 130 is a Motorola Semiconductor MC145416 tone/pulse dialer, with 10 number memory and three emergency numbers. In addition to the necessary basics features of pulse, tone, or mixed dialing, and 10×16 digit memories inclusive of last number redial, the matrix IC 130 provides the advanced features of flash, 3×16 dedicated memories, signal output inhibited during memory storage, note pad programming, and convenient operation sequence by a 6×4 keyboard interface.

The matrix IC 130 determines when an electrical signal from at least one column sensor and an electrical signal from at least one row sensor are detected. It is normally expected that the signal from the column sensor arrives simultaneously with the signal from the row sensor. Any significant relative delay between such signals indicates an error condition in the optical laser numeric keypad 100 configuration.

For example, if a "6" key location 318 is selected, a change (i.e., an interruption) of a received light quantity by one of the row optical sensors 134 causes the row optical sensor to assert or deassert an electrical signal to the matrix IC 130. Similarly, the selection of the "6" key location 318 results in a change (i.e., an interruption) of a received light quantity received by one of the column sensors 132, and causes the column optical sensor to assert or deassert an electrical signal to the matrix IC 130. A distinct pair of optical sensors provides two electrical signals to the matrix IC 130, and causes the matrix IC 130 to provide a response that includes a digital signal 142.

It is normally expected that at most one key will be selected at any given time; that is, that a user will not select multiple keys at once, and will not select a second key until a first key is released. Accordingly, when an electrical signal from at least one column sensor and an electrical signal from at least one row sensor are detected, the matrix IC 130 is disabled until all electrical signals indicate that no location is selected.

In one embodiment, the selection of multiple keys disables the matrix IC 130 until all keys are released. The matrix IC 130 only recognizes a transition from a state in which no keys are pressed to a state in which one key is pressed. If a second key is pressed before a first key is released, and the first key is released while the second key remains selected, then the second key is not recognized, since the second key was pressed while another key was selected. If more than one key is pressed, the matrix IC 130 responds only to the key that is pressed at least slightly earlier or earliest, and does not accept the key or keys that are pressed at least slightly later until all keys are released. Releasing all keys clears the matrix IC 130 to accept further input from the photo diodes.

In other embodiments, the selection of multiple keys disables the matrix IC 130 until no more than one key is selected. The matrix IC 130 recognizes any transition to a state in which one key is pressed. If a user selects a second key before a first key is released, the matrix IC 130 accepts the second key as soon as the first key is released. If a second key is pressed before a first key is released, and the first key is released while the second key remains selected, then the second key is recognized as soon as the first key is released. If more than one key is pressed, the matrix IC 130 responds only to the key that is pressed at least slightly earlier or earliest, and does not accept the key or keys that are pressed at least slightly later until all keys are released.

FIG. 2 shows a perspective representation of a cavity 200 located at a key location within the keypad of FIG. 1. The Key location of FIG. 2 is configured as a cavity having a top opening for a user to insert a finger and also having two optical paths through the cavity. The two optical paths form an intersection of light beams (i.e., the light beam propagating through the row 202 and the light beam propagating through the column 204) that may be interrupted within the cavity 200 when an opaque object is inserted into the cavity from the top opening. For example, the "6" key location 318 includes an intersection of a light beam 202 and a light beam 204 that may be interrupted when an opaque object is inserted into the cavity at the "6" key location 318.

The cavity is devoid of opaque matter, and the light beams may pass through the cavity unobstructed except when an opaque object is inserted into the region. Alternately, the cavity may contain an optical liquid crystal element. The optical liquid crystal element may become an opaque object that obstructs the light beam under pressure applied by a user's finger. Alternately, the optical liquid crystal element may become a highly refractive object that diverts the light beam under pressure applied by a user's finger, or under an electrical potential across the optical liquid crystal element.

The key location shown in FIG. 2 is located at the intersection of a row 202 and a column 204. Light passing through the row 202 passes through the cavity 200 in one direction, and light passing through the column 204 also passes through the cavity 200 in another direction. The light passing through the column 204 does not interfere with the light passing through the row 202, and the light passing through the row 202 does not interfere with the light passing through the column 204. However, the cavity 200 is configured such that light passing through a cavity 200 in each direction is either interrupted in both directions concurrently or not interrupted at all.

The light through the cavity 200 may be interrupted by the insertion of an opaque object (not shown) into the cavity 200. The opaque object may be, for example, a person's finger, or a tip of a pen, or other object. Accordingly, a person may select a key location by inserting a finger or other object into a cavity 200 at a key location. The insertion of an opaque object into the cavity 200 interrupts the light in both directions and prevents the light from reaching the left edge and bottom edge of the keypad.

In one embodiment, a thin, flexible transparent layer 330 covers all or some of the cavities. The thin, flexible transparent layer 330, shown in FIG. 3 and FIG. 4, prevents dust or debris from falling into the cavities. Such dust or debris may obstruct the transmission of light. The thin, flexible transparent layer 330 is sufficiently flexible to be easily pressed into the cavity 200 when a user presses the thin, flexible transparent layer 330. Because the beams of light through the cavities are so close to the thin, flexible transparent layer 330, a deflection of the thin, flexible transparent layer 330 of only 0.1 millimeter flex would be enough to break the light. In one embodiment, the cavity 200 is approximately 0.2 millimeter deep, 0.5 centimeters wide and 0.5 centimeters long. Alternately, buttons may be used that can be pressed down into the cavity 200 to interrupt the transmission of light through the cavity 200. The buttons may each be configured of a flexible membrane. Alternately, the buttons may be configured integrally with the thin, flexible transparent layer 330. Such flexible layers and membranes eliminate any need for springs.

FIG. 3 shows a cross section of one of the rows 202 in the keypad of FIG. 1 taken along line AA' in FIG. 1, illustrating a path of light through a row 202 of numeric keypad. The row 202 shown in FIG. 3 has a "4" key location 314, a "5" key location 316, and a "6" key location 318. The key location 314 represents the "4" key of FIG. 1, but could similarly represent the "7" key location 308, the "*" key location 302, or the "1" key location 320 in cross sections taken along other lines. The key location 316 represents the "5" key of FIG. 1, but could similarly represent the "8" key location 310, the "0" key location 304 or the "2" key location 322 in cross sections taken along other lines. The key location 318 represents the "6" key of FIG. 1, but could similarly represent the "9" key location 312, the "#" key location 306 or the "3" key location 324 in cross sections taken along other lines. Only one light beam (i.e., the light beam parallel both to the plane of FIG. 1 and to the plane of FIG. 3) is shown, but it will be understood that a light beam also passes through each of the cavities embodying the key locations 314–318 shown in FIG. 3 in a direction perpendicular to the plane of FIG. 3 and parallel to the plane of FIG. 1. The light beam is selectably interruptible at each key location. To select a key location, a user either presses a button at the location or places a finger within a cavity at the location.

FIG. 3 also shows the thin, flexible transparent layer 330 that (in one embodiment) covers all or some of the cavities. The thin, flexible transparent layer 330 prevents dust or debris from falling into the cavities. Such dust or debris may obstruct the transmission of light. The thin, flexible transparent layer 330 is sufficiently flexible to be easily pressed into any of the cavities 314–318 when a user presses the thin, flexible transparent layer 330.

Figure 4:
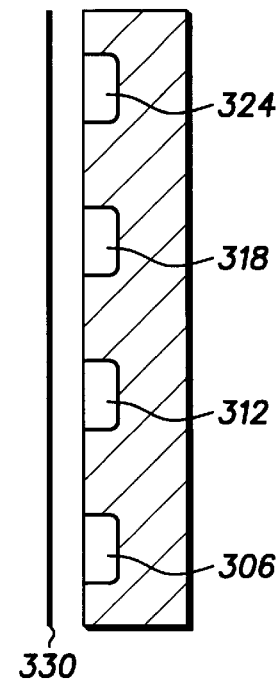
FIG. 4 is cross section of one of the columns in the keypad of FIG. 1, illustrating a path of light through one of the columns of numeric keypad.

FIG. 4 shows a cross section of one of the columns 204 in the keypad of FIG. 1 taken along line BB' in FIG. 1, illustrating a path of light through a column 204 of numeric keypad. The column 204 shown in FIG. 4 has a key location 306, a key location 312, and key locations 318 and 324. The key location 324 represents the "3" key of FIG. 1, but could similarly represent the "1" key location 320 key or the "2" key location 322 key in cross sections taken along other lines. The key location 318 represents the "6" key of FIG. 1, but could similarly represent the "4" key location 314 or the "5" key location 316 in cross sections taken along other lines. The key location 312 represents the "9" key of FIG. 1, but could similarly represent the "7" key location 308 or the "8" key location 310 in cross sections taken along other lines. Only one light beam (i.e., the light beam parallel both to the plane of FIG. 1 and to the plane of FIG. 4) is shown, but it will be understood that a light beam also passes through each of the cavities embodying the key locations 306–324 shown in FIG. 4 in a direction perpendicular to the plane of FIG. 4 and parallel to the plane of FIG. 1. The light beam is selectably interruptible at each key location. To select a key location, a user either presses a button at the location or places a finger within a cavity at the location.

FIG. 4 also shows the thin, flexible transparent layer 330 that (in one embodiment) covers all or some of the cavities. The thin, flexible transparent layer 330 prevents dust or debris from falling into the cavities. Such dust or debris may obstruct the transmission of light. The thin, flexible transparent layer 330 is sufficiently flexible to be easily pressed into any of the cavities in which key locations 306–324 are implemented when a user presses the thin, flexible transparent layer 330.

FIG. 5 shows an optical laser numeric keypad 400, according to one embodiment of the present invention. The optical laser numeric keypad 400 resides within a wireless telephone 500B. The optical laser numeric keypad 400 of FIG. 5 operates similarly to the optical laser numeric keypad 100 of FIG. 1, with the following exceptions. The key locations of the optical laser numeric keypad 400 of FIG. 5 are divided into fields 418 and 420. Each of the first field 418 and the second field 420 includes several key locations that are organized into a plurality of rows and a plurality of columns. In particular, each field includes twelve keys, organized into four rows and three columns, but other configurations are possible. Each key location is at the intersection of a row and a column within a field.

The optical laser numeric keypad 400 of FIG. 4, like the optical laser numeric keypad 100 of FIG. 1, includes an optical source 402, such as a laser diode or other LED (light emitting diode), that provides a light beam to the optical laser numeric keypad 400. However, in the optical laser numeric keypad 400 of FIG. 4, the light beam is split into three light pipes rather than two light pipes. One of the light pipes of the optical laser numeric keypad 400 is a horizontally oriented light pipe 424, located at the "top" of the optical laser numeric keypad 400, like the optical laser numeric keypad 100 of FIG. 1. The second light pipe is a vertically oriented light pipe 426, located to the right of the "3" key location 524, the "6" key location 518, the "9" key location 512, and the "#" key location 506. A third light pipe 428 extends past each field.

The horizontally oriented light pipe 424 receives light from the optical source 402 and provides all of the light to a horizontally oriented light pipe's first hologram 404. The horizontally oriented light pipe's first hologram 404 is a ⅓ reflector. This means that the horizontally oriented light pipe's first hologram 404 is designed to reflect approximately one-third of the light that the horizontally oriented light pipe's first hologram 404 receives toward the "3" key location 524, the "6" key location 518, the "9" key location 512, and the "#" key location 506 keys. This also means that the horizontally oriented light pipe's first hologram 404 is designed to transmit approximately two-thirds of the light that the vertically oriented light pipe first hologram 120 receives toward the horizontally oriented light pipe's second hologram 406. Accordingly, the "3" key location 524, the "6" key location 518, the "9" key location 512, and the "#" key location 506 keys receive one-third of the light in the horizontally oriented light pipe 424.

The horizontally oriented light pipe's second hologram 406 is a 50% reflector. This means that the horizontally oriented light pipe's second hologram 406 is designed to reflect approximately one-half of the light that the horizontally oriented light pipe's first hologram 404 receives toward the "2" key location 522, the "5" key location 516, the "8" key location 510, and the "0" key location 504 keys. This also means that the horizontally oriented light pipe's second hologram 406 is designed to transmit approximately one-half of the light that the horizontally oriented light pipe's second hologram 406 receives toward the horizontally oriented light pipe's third hologram 408. Accordingly, the "2" key location 522, the "5" key location 516, the "8" key location 510, and the "0" key location 504 receive one-third of the light in the horizontally oriented light pipe 424.

The horizontally oriented light pipe's third hologram 408 is a 100% reflector. This means that the horizontally oriented light pipe's third hologram 408 is designed to reflect substantially all of the light the horizontally oriented light pipe's third hologram 408 receives toward the "1" key location 520, the "4" key location 514, the "7" key location 508, and the "*" key location 502 keys. Accordingly, the "1" key location 520, the "4" key location 514, the "7" key location 508, and the "*" key location 502 receive one-third of the light in the horizontally oriented light pipe 424.

The light from the horizontally oriented light pipe's first hologram 404 in the horizontally oriented light pipe 424 that is directed toward the "3" key location 524, the "6" key location 518, the "9" key location 512, and the "#" key location 506 keys, however, is also allowed to propagate through the "C" key location 554, the "F" key location 548, the "I" key location 542, and the "L" key locations. The light from the horizontally oriented light pipe's second hologram 406 in the horizontally oriented light pipe 424 that is directed toward the "2" key location 522, the "5" key location 516, the "8" key location 510, and the "0" key location 504 keys is allowed to propagate through the "B" key location 552, the "E" key location 546, the "H" key location 540, and the "K" key location 534. The light from the horizontally oriented light pipe's third hologram 408 in the horizontally oriented light pipe 424 that is directed toward the "1" key location 520, the "4" key location 514, the "7" key location 508, and the "*" key location 502 keys is allowed to propagate through the "A" key location 550, the "D" key location 544, the "G" key location 538, and the "J" key location 532 key locations.

The column optical sensors 410 of FIG. 5 is located below the "J" key location 532, the "K" key location 534, and the "L" key location 536 of the second field 420, unlike the column optical sensors 132 of FIG. 1 which are located below the "*" key location 302, the "0" key location 304, and the "#" key location 306.

Moreover, in the optical laser numeric keypad 400 of FIG. 5, the light from the vertically oriented light pipe's first hologram 430 is directed toward the "1" key location 520, the "2" key location 522, and the "3" key location 524 of the first field 418 is reflected from two additional reflectors 444 and 446 toward the "A" key location 550, the "B" key location 552, and the "C" key location 554 key locations of the second field 420. The light from the second embodiment vertically oriented light pipe's second hologram 432 in the vertically oriented light pipe 426 that is directed toward the "4" key location 514, the "5" key location 516, and the "6" key locations of the first field 418 is reflected from two additional reflectors 448 and 450 toward the "D" key location 544, the "E" key location 546, and the "F" key location 548, of the second field 420.

The light from the third hologram 434 in the vertically oriented light pipe 426 that is directed toward the "7" key location 508, the "8" key location 510, and the "9" key location 512, of the first field 418 is reflected from two additional reflectors 452 and 454 toward the "G" key location 538, the "H" key location 540, and the "I" key location 542 key locations of the second field 420. The light from the fourth hologram 436 in the vertically oriented light pipe 426 that is directed toward the "*" key location 502, the "0" key location 504, and the "#" key location 506 of the first field 418 is reflected from two additional reflectors 456 and 458 toward the "J" key location 532, the "K" key location 534, and the "L" key location 536 of the second field 420.

The row optical sensors 412 of FIG. 5 is located to the right of the "C" key location 554, the "F" key location 548, the "I" key location 542, and the "L" key location 536 of the second field 420, unlike the column optical sensors 134 of FIG. 1 which are located to the left of the "1" key location 320, the "4" key location 314, the "7" key location 308, and the "*" key location 302.

The optical laser numeric keypad 400 of FIG. 5 includes a third light pipe 428. The third light pipe 428 includes an optical diverter and sixteen optical reflectors. The optical diverter is, like the optical diverters of FIG. 1, a hologram. The third pipe's first hologram 460 is a partially reflective, partially transmissive mirror created by holography. The first hologram 460 of the third light pipe 428 is a 50% reflector, meaning the third pipe's first hologram 460 is designed to reflect approximately one-half of the light that the third pipe's first hologram 460 receives toward the first field 418, and to transmit approximately one-half of the light that the third pipe's first hologram 460 receives toward the third light pipe's optical reflector 560. Accordingly, the keys of the first field 418 receive one-half of the light in the third light pipe 428.

The light reflected from the third pipe's first hologram 460 third light pipe's hologram 428 passes through every key location of the first field 418. To avoid interfering with the light passing along the rows and columns of the first field 418 as explained in FIG. 1, the light from the third light pipe 428 is directed diagonally. The light reflected from the third pipe's first hologram 428 passes through the "3" key location 524. After passing through the "3" key location 524, the light is deflected, by the first field's first optical reflector 462 and first field's second optical reflector 464, toward and through the "2" key location 522 and the "6" key location 518.

After passing through the "2" key location 522 and the "6" key location 518, the light is deflected by the first field's third optical reflector 466 and the first field's fourth optical reflector 468 toward and through the "9" key location 512, the "5" key location 516, and the "1" key location 520. After passing through the "9" key location 512, the "5" key location 516, and the "1" key location 520, the light is deflected, by the first field's fifth optical reflector 470 and the first field's sixth optical reflector 472, toward and through the "4" key location 514, the "8" key location 510, and the "#" key location 504.

After passing through the "4" key location 514, the "8" key location 510, and the "#" key location 506, the light is deflected by the first field's seventh optical reflector 474 and first field's eighth optical reflector 476 toward and through the "7" key location 508 and the "0" key location. After passing through the "7" key location 508 and the "0" key locations, the light is deflected, by the ninth optical reflector 478 and the first field's tenth optical reflector 480, toward and through the "*" key location 502.

The light transmitted by the third light pipe's hologram 460 passes through every key location of the second field 420. To avoid interfering with the light passing along the rows and columns of the second field 420 as explained in FIG. 1, the light from the third light pipe 428 is directed diagonally. The light transmitted by the third light optical diverter 460 is reflected by the second field's first optical reflector 560 and passes through the "C" key location 554. After passing through the "C" key location 554, the light is deflected by the second field's second optical reflector 562 and the second field's third optical reflector 564 toward and through the "B" key location 552 and the "F" key location 548.

After passing through the "B" key location 552 and the "F" key location 548 key locations, the light is deflected by the second field's fourth optical reflector 566 and the second field's fifth optical reflector 568 toward and through the "I" key location 542, the "E" key location 546, and the "A" key location 550. After passing through the "I" key location 542, the "E" key location 546, and the "A" key location 550 key locations, the light is deflected by the second field's sixth optical reflector 570 and the second field's seventh optical reflector 572 toward and through the "D" key location 544, the "H" key location 540, and the "L" key location 536. After passing through the "D" key location 544, the "H" key location 540, and the "L" key location 536, the light is deflected by the second field's eighth optical reflector 574 and the ninth optical reflector 576 toward and through the "K" key location 534 and the "G" key location 538. After passing through the "K" key location 534 and the "G" key location 538, the light is deflected by the second field's eleventh and twelfth optical reflectors 578 and 580 toward and through the "J" key location 532.

The optical laser numeric keypad 400 also includes a plurality of row optical sensors 412 and column optical sensors 410, like the optical laser numeric keypad 100 of FIG. 1. However, the optical laser numeric keypad 400 of FIG. 5 also has a group of optical sensors 416 associated with the fields and with the third light pipe 428. Optical sensor 416A is configured to receive the light from the third light pipe 428 that passes through the "*" key location 502 key. The other optical sensor 416B is configured to receive the light from the third light pipe 428 that passes through the "J" key location 532 key. Each of the plurality of optical sensors can be, for example, a photo diode. Each is sufficiently sensitive to detect light energy no greater than one-half the light in the third light pipe 428. Each photo diode detects whether light passing through the field is obstructed in at least one cavity at a key location in the corresponding field, and provides a signal when no location in the corresponding field interrupts the light diverted to the field.

Each of the key locations includes a means for a user to interrupt the light passing through the key location. For example, the "6" key location 518 includes an intersection of a light beam 606 and a light beam 608 that may be interrupted when an opaque object is inserted into the cavity at the "6" key location 518.

The matrix IC 590 of the optical laser numeric keypad 400 of FIG. 5 is coupled to receive a row signal from each of the row sensors 412, a column signal from each of the column optical sensors 410, and a field signal from each of the field optical sensors 416. The matrix IC 590 provides a location identifier 454. The matrix IC 590 includes a ten-bit parallel-load input buffer. Nine bits of the matrix IC 590 are coupled to receive the electrical signals from the various optical sensors, including four electrical signals from the row sensors 412, three signals from the column sensors 410, and two signals from the first field sensor 416A and the second field sensor 416B. The remaining bit of the matrix IC 590 input buffer is not used. Alternately, the remaining bit is used for error detection. In response to the electrical signals from the various optical sensors 410–416, the matrix IC 590 provides a digital signal (shown as 454) that indicates, as a binary number, which key location is selected.

The matrix IC 590 determines when an electrical signal from at least one column sensor, an electrical signal from at least one row sensor, and an electrical signal from at least one field sensor are detected. It is normally expected that the signal from the column sensor, the signal from the row sensor, and the signal from the field sensor arrive simultaneously. Any significant relative delay between such signals indicates an error condition in the optical laser numeric keypad 400 configuration.

For example, if a "6" key location 518 is selected, a change (i.e., an interruption) of a received light quantity received by one of the row optical sensors 412B causes the row optical sensor 412B to assert or deassert an electrical signal to the matrix IC 590. Similarly, the selection of the "6" key location 518 results in a change (i.e., an interruption) of a received light quantity received by one of the column sensors 410C, and causes the column optical sensor to assert or deassert an electrical signal to the matrix IC 590. Also, the selection of the "6" key location 518 results in a change (i.e., an interruption) of a received light quantity received by the field column sensors 416A, and causes the field optical sensor to assert or deassert an electrical signal to the matrix IC 590. A distinct set 416A, 410C and 412B of the plurality of optical sensors provides electrical signals to the matrix IC 590, and causes the matrix IC 590 to provide a response that includes a digital signal.

It is also normally expected that at most one key will be selected at any given time; that is, that a user will not select multiple keys at once, and will not select a second key until a first key is released. Accordingly, when an electrical signal from at least one column sensor, an electrical signal from at least one row sensor, and an electrical signal from at least one field sensor are detected, the matrix IC 590 is disabled until all electrical signals indicate that no location is selected. In one embodiment, the selection of multiple keys disables the matrix IC 590 until all keys are released. The matrix IC 590 only recognizes a transition from a state in which no keys are pressed to a state in which one key is pressed. If a second key is pressed before a first key is released, and the first key is released while the second key remains selected, then the second key is not recognized, since the second key was pressed while another key was selected. If more than one key is pressed, the matrix IC 590 responds only to the key that is pressed at least slightly earlier or earliest, and does not accept the key or keys that are pressed at least slightly later until all keys are released. Releasing all keys clears the matrix IC 590 to accept further input from the photo diodes.

In other embodiments, the selection of multiple keys disables the matrix IC 590 until no more than one key is selected. The matrix IC 590 can recognize any transition to a state in which one key is pressed. If a user selects a second key before a first key is released, the matrix IC 590 accepts the second key as soon as the first key is released. If a second key is pressed before a first key is released, and the first key is released while the second key remains selected, then the second key is recognized as soon as the first key is released. If more than one key is pressed, the matrix IC 590 responds only to the key that is pressed at least slightly earlier or earliest, and does not accept the key or keys that are pressed at least slightly later until all keys are released.

The optical laser numeric keypad thus described may be used in conjunction with a telephone or other telephone device. Other devices, such as handheld calculators and personal data assistants that accept data using key locations, may also be used in conjunction with various aspects of the present invention. The optical laser numeric keypad allows the wireless telephone to interface between a user and a telephone system. For example, the wireless telephone may be configured to go "off hook" and connect to the telephone system. The wireless telephone may then allow the user to enter a telephone number using the optical laser numeric keypad. The wireless telephone may then dial the entered telephone number.

In summary, The optical laser numeric keypad 400 is configured to provide a digital signal. The digital signal is indicative of which of a plurality of key locations is selected. The optical laser numeric keypad 400 includes one or more of optical sensors 410, 412 and 416. Each of the plurality of optical sensors is configured to respond to a change in a received light quantity and to provide an electrical signal in response to a selection of a key at a key location. The received light quantity of at least one of the plurality of optical sensors 410, 412 and 416 is changeable by selection of a key location.

Each corresponding key location in each field is associated with a distinct set of the plurality of optical sensors 410 and 412, for example a distinct pair of the optical sensors 410 and 412. A selection of a key location causes a response at the corresponding set of the optical sensors 410 and 412, for example at the corresponding pair of optical sensors (one of the row optical sensors 412 and one of the column optical sensors 410). The third set of optical sensors 416 determines whether a corresponding key was select from the first field 418 or second field 420.

A key location is configured to admit a received light quantity toward the corresponding optical sensor. The optical sensor is configured to receive the received light quantity. The key location is defined by a row of key locations and a column of key locations. In one embodiment, the optical laser numeric keypad 400 resides within and controls a wireless telephone.

The holograms are, in effect, optical diverters or partial optical diverters, configured to route a light beam among the plurality of key locations. In one embodiment, the optical sensors 410, 412 and 416 include photo diodes. The photo diodes are configured to provide an electrical signal when light is received and to suppress the electrical signal when light is not received. The matrix IC 590 provides a location identifier 454, a digital signal implemented as a binary number. The binary number includes a bit for each of the row optical sensors and a bit for each of the columns optical sensors.

In one embodiment, the optical laser numeric keypad 400 is part of a wireless telephone. The wireless telephone is useful for interfacing between a user and a telephone system.

In addition to the optical laser numeric keypad 400, the wireless telephone also includes a hook apparatus 622, for connecting a telephone call to a telephone system 624.

In one embodiment, a user may use a wireless telephone. The user selects a key location of the wireless telephone (or a series of key locations). In response, a matrix IC 130 or 590 generates a digital signal indicative of which of the key locations has been selected. The matrix IC 590 generates the digital signal based on a plurality of optical sensors 410, 412 and 416. Each of the plurality of optical sensors is configured to respond to a change in a received light quantity and to provide an electrical signal in response to a selection of a key at a key location. The matrix IC 590 provides the location identifier 454 corresponding to the selected key.

The method provides an electrical signal in response to a selection of a key at a key location associated with a distinct set of the optical sensors 410, 412 and 416. Doing so causes a response at the corresponding set of the optical sensors 410, 412 and 416, such as a set of optical sensors 410, 412 and 416, indicative of a specific selection of a key location.

In one embodiment, the optical source may be replaced with ambient light. Alternately, the optical source may be replaced with multichromatic light and the holograms configured to use spectral dispersion to split the light. The optical source 402 may also be configured to illuminate the locations.

Each key location may be associated with a distinct set of the optical sensors 410 and 412, such as a pair of optical sensors 410 and 412, such that a selection of a key location causes a response at the corresponding set (or pair) of optical sensors 410 and 412. The key locations are configured to admit a received light quantity toward each of the plurality of optical sensors associated therewith, the optical sensor is configured to receive the received light quantity.

As illustrated, the disclosed optical laser numeric keypad can be designed for wireless telephones that are far less bulky than previously possible. Also, by eliminating or significantly reducing the number of moving parts such as pad buttons, the optical laser numeric keypad is far less prone to failure. The optical laser numeric keypad makes possible a wireless telephone having a thin profile and without a large number of moving parts.

Figure 6:
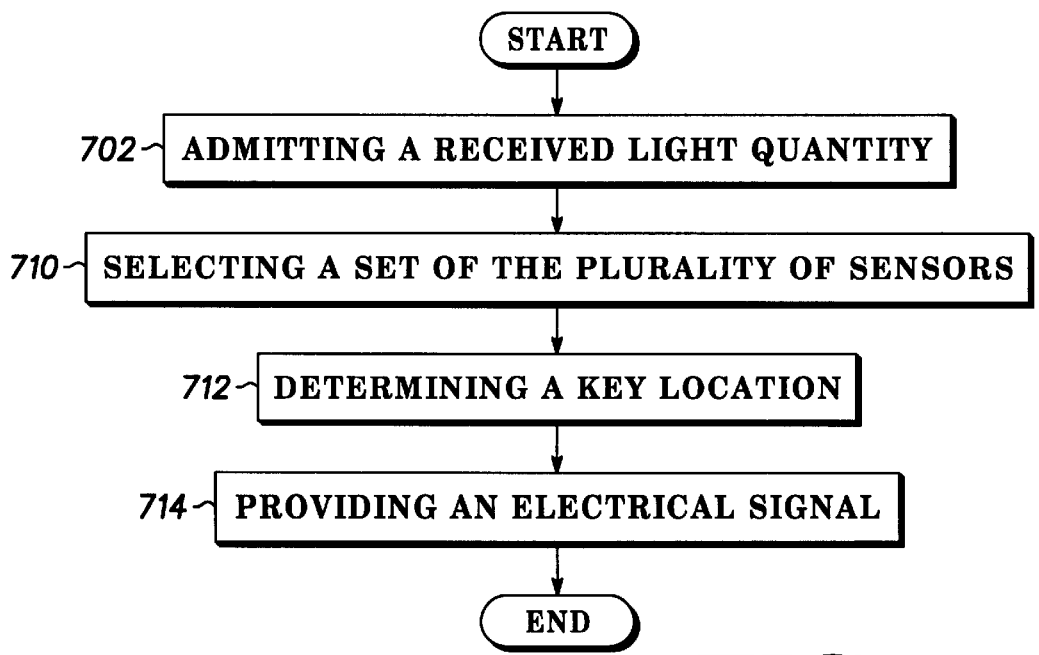
FIG. 6 shows a method for using a wireless telephone, according to one embodiment of the present invention.

FIG. 6 shows a method for using a wireless telephone, according to one embodiment of the present invention. The wireless telephone performs a step for admitting a received light quantity 702 into an optical numeric laser keypad 100. The received light quantity may be generated within the wireless telephone, or may be admitted from outside the wireless telephone. The method includes a next step of selecting a set of the plurality of optical sensors 710, in response to the selection of a key location. The wireless telephone further performs a step of determining a selected key location 712. In other words, selecting the set of the plurality of optical sensors 710 is indicative of selecting of a specific key location. The wireless telephone then performs a step providing an electrical signal 714. The electrical signals, derived from the plurality of optical sensors to the matrix IC, allows the matrix IC to make the user's selection of a key location available to software, since the matrix IC is a register accessible to another device, such as a microcontroller within the wireless telephone. Preferably, the wireless telephone performs a step of providing a digital signal from the matrix IC to the microcontroller.

It should be understood that the implementation of other variations and modifications of the invention in its various aspects will be apparent to those of ordinary skill in the art, and that the invention is not limited by the specific embodiments described. For example, the cavity may include several key locations rather than one key location. It is therefore contemplated to cover by the present invention, any and all modifications, variations, or equivalents that fall within the spirit and scope of the basic underlying principles disclosed and claimed herein.

What is claimed is:

1. An optical laser numeric keypad configured to provide an electrical signal indicative of which of a plurality of key locations is selected, the optical laser numeric keypad comprising:

a plurality of optical sensors each configured to respond to a change in a received light quantity and to provide an electrical signal in response to selecting of a key at a key location, the received light quantity of at least one of the plurality of optical sensors being changeable by selection of a key location; and a key location indentifier configured to provide a binary number having a bit for each of the row optical sensors and further having a bit for each of the column optical sensors.

2. The optical laser numeric keypad of claim 1, wherein each of the key locations is associated with a distinct set of the plurality of optical sensors, such that selecting of a key location causes a response at the corresponding set of the plurality of optical sensors.

3. The optical laser numeric keypad of claim 1, wherein each of the plurality of key locations is associated with a distinct pair of the plurality of optical sensors, such that selecting of a key location causes a response at the corresponding pair of optical sensors including one of a row optical sensor and one of a column optical sensor.

4. The optical laser numeric keypad of claim 1, wherein a key location is configured to admit a received light quantity toward each of the plurality of optical sensors associated therewith, each of the plurality of optical sensors configured to receive the received light quantity.

5. The optical laser numeric keypad of claim 1, wherein each of the plurality of key locations is defined by a row of key locations and a column of key locations.

6. The optical laser numeric keypad of claim 1, wherein the optical laser numeric keypad resides within and controls a wireless telephone.

7. The optical laser numeric keypad of claim 1, further comprising an optical diverter configured to route a light beam among the plurality of key locations, wherein the optical diverter is a hologram.

8. The optical laser numeric keypad of claim 1, wherein the optical source includes a laser diode and the optical sensors include photo diodes configured to provide an electrical signal when light is received from the optical source and to suppress the electrical signal when light is not received from the optical source.

9. An apparatus for interfacing with a telephone system, the apparatus comprising:

an optical laser numeric keypad configured to provide an electrical signal indicative of which of a plurality of key locations is selected, the optical laser numeric keypad comprising an optical source and a plurality of optical sensors each configured to respond to a change in a received light quantity and to provide an electrical signal in response to selecting of a key at a key location, the received light quantity of at least one of the plurality of optical sensors being changeable by selection of a key location, wherein a light beam from the optical source passes through an optical liquid crystal element within a cavity at each of the plurality of key locations, the light beam being selectably interruptible at each of the plurality of key locations by the application of an electrical potential across the optical liquid crystal element within the cavity sufficient to polarize the optical liquid crystal element orthogonally to the light beam.

10. The apparatus of claim 9, wherein each of the plurality of key locations is associated with a distinct set of the plurality of optical sensors, such that selecting of a key location causes a response at the corresponding set of the plurality of optical sensors.

11. The apparatus of claim 9, wherein each of the plurality of key locations is associated with two of a distinct pair of the plurality of optical sensors, such that selecting of a key location causes a response at the corresponding pair of optical sensors including one of a row optical sensor and one of a column optical sensor.

12. The apparatus of claim 9, wherein a key location is configured to admit a received light quantity toward each of the plurality of optical sensors associated therewith, the optical sensor configured to receive the received light quantity.

13. The apparatus of claim 9, herein the key location resides within a row of key locations and also resides within a column of key locations.

14. The apparatus of claim 9, wherein the apparatus resides within and controls a wireless telephone.

15. The apparatus of claim 9, wherein the light beam passes through a cavity at each of the plurality of key locations, the light beam being selectably interruptible at each of the plurality of key locations by inserting of an opaque object within the cavity.

16. An apparatus for interfacing with a telephone system, the apparatus comprising:

an optical laser numeric keypad configured to provide an electrical signal indicative of which of a plurality of key locations is selected, the optical laser numeric keypad comprising an optical source and a plurality of optical sensors each configured to respond to a change in a received light quantity and to provide an electrical signal in response to selecting of a key at a key location, the received light quantity of at least one of the plurality of optical sensors being changeable by selection of a key location, wherein the optical source is configured to provide a light beam having a plurality of frequencies, at least one frequency for each of the rows and at least one frequency for each of the columns; and an optical diverter including a hologram having spectral dispersion elements to divert a portion of the light to each of the plurality of columns and a portion of the light to each of a plurality of rows, such that each of the plurality of rows and each of the plurality of columns receives a different frequency.

* * * * *